United States Patent
Liu et al.

(10) Patent No.: US 11,906,575 B2
(45) Date of Patent: Feb. 20, 2024

(54) ELECTRICAL POWER ANALYZER FOR LARGE AND SMALL SCALE DEVICES FOR ENVIRONMENTAL AND ECOLOGICAL OPTIMIZATION

(71) Applicant: INTERNATIONAL BUSINESS MACHINES CORPORATION, Armonk, NY (US)

(72) Inventors: Jia Liu, Astoria, NY (US); Zhiyuan Li, Long Island City, NY (US); Dean Steuer, White Plains, NY (US); Hyman David Chantz, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 695 days.

(21) Appl. No.: 16/854,776

(22) Filed: Apr. 21, 2020

(65) Prior Publication Data
US 2021/0325447 A1 Oct. 21, 2021

(51) Int. Cl.
| | |
|---|---|
| *G01R 31/08* | (2020.01) |
| *G01R 31/28* | (2006.01) |
| *H02J 13/00* | (2006.01) |
| *G06N 20/00* | (2019.01) |

(52) U.S. Cl.
CPC ..... *G01R 31/2839* (2013.01); *G01R 31/2846* (2013.01); *G06N 20/00* (2019.01); *H02J 13/00002* (2020.01); *H02J 13/00022* (2020.01)

(58) Field of Classification Search
CPC .. G01R 21/06; G01R 21/133; G01R 31/2825; G01R 31/2839; G01R 31/2846; G01R 31/2836; G01R 31/2837; G06F 1/28; G06F 1/305; G06F 1/3203; G06F 1/3209; G06F 1/3287
See application file for complete search history.

(56) References Cited

U.S. PATENT DOCUMENTS

| | | | | |
|---|---|---|---|---|
| 8,694,291 | B2 * | 4/2014 | Chu | G06F 30/367 |
| | | | | 703/2 |
| 9,823,283 | B2 | 11/2017 | Kabler et al. | |
| 9,857,414 | B1 * | 1/2018 | Kabler | G01R 35/005 |
| 10,598,706 | B2 * | 3/2020 | Chiou | G01R 19/2506 |
| 2013/0191103 | A1 * | 7/2013 | Chu | G06F 30/367 |
| | | | | 703/14 |

(Continued)

OTHER PUBLICATIONS

Mell, P. et al., "Recommendations of the National Institute of Standards and Technology"; NIST Special Publication 800-145 (2011); 7 pgs.

(Continued)

*Primary Examiner* — Thang X Le
(74) *Attorney, Agent, or Firm* — Intelletek Law Group, PLLC; Gabriel Daniel, Esq.

(57) ABSTRACT

A device, system, and a computer-implemented method a for identifying an anomaly in an operation of a device includes comparing, by an electrical power analyzer, a current power draw signature of the device with a known power draw signature of the device. There is a determining as to whether at least one anomaly is present in the current power draw signature. A warning is generated in response to determining the at least one anomaly is present in the current power draw signature.

20 Claims, 8 Drawing Sheets

(56) References Cited

U.S. PATENT DOCUMENTS

| | | | |
|---|---|---|---|
| 2014/0333324 A1* | 11/2014 | Kabler | G06Q 50/06 |
| | | | 324/537 |
| 2015/0372416 A1* | 12/2015 | Ashby | H01R 13/719 |
| | | | 439/181 |
| 2017/0192398 A1 | 7/2017 | Nasle | |
| 2018/0196098 A1* | 7/2018 | Ferguson | H02H 3/042 |
| 2018/0259571 A1* | 9/2018 | Castelli | G01R 31/2825 |
| 2018/0306476 A1 | 10/2018 | Brady et al. | |
| 2019/0154753 A1 | 5/2019 | Castelli et al. | |
| 2019/0181638 A1* | 6/2019 | Chapel | H02J 13/0082 |

OTHER PUBLICATIONS

Kushiro, N. et al., Can Electric Devices be Identified from Their Signatures of Waveform?—IEEE Conference Communications and Networking Conference (CCNC-2015), 6 pgs.

Video, This is Sense. Sense installs in your home's electrical panel and provides insight into your energy use and home activity through our iOS, Android, and web apps, https://www.facebook.com/watch/?v=280632679552842, downloaded Oct. 24, 2023, 3 pgs.

* cited by examiner

ELECTRICAL POWER ANALYZER FOR LARGE AND SMALL SCALE DEVICES FOR ENVIRONMENTAL AND ECOLOGICAL OPTIMIZATION

BACKGROUND

Technical Field

The present disclosure generally relates to power usage, and more particularly to predictive failure analysis for large and small scale devices.

Description of the Related Art

The predictive failure analysis of large scale and small scale devices subject to failure can assist in determining which devices are likely to be repaired or replaced.

SUMMARY

According to various embodiments, a computer-implemented method, device, and system for identifying an anomaly in an operation of a device includes comparing, by an electrical power analyzer coupled to an electrical outlet, a current power draw signature of the device with a known power draw signature of the device to determine whether anomalies are present in the current power draw signature. A warning is generated in response to determining anomalies are present in the current power draw signature.

In an embodiment, the generating of the warning includes determining whether the identified anomalies include failure-indicating activity associated with an imminent failure of the device.

In an embodiment, the known power draw signature of the device is generated locally prior to performing the comparing operation with the current power draw signature of the device.

In an embodiment, the electrical power analyzer receives a device power profile including the known power draw signature of the device.

In an embodiment, there is a collection of the device power profile from a plurality of similarly classified types of devices.

In an embodiment, machine learning techniques are utilized to identify anomalous or failure-indicating activity.

In an embodiment, a power draw signature of additional devices coupled to the first device are identified by the electrical analyzer via an Internet of Things (IoT) network. The electrical power analyzer can identify a device profile by a comparison with other device profiles received over the Internet from a repository.

In an embodiment, there is a review of the power draw signature of the device over a predetermined time period, and a determining as to whether the identified anomalies over the predetermined time period indicate a degradation of a device operation.

In an embodiment, the generating of the warning includes recommending at least one of repair or replacement of the device based on the identified anomalies.

In one embodiment, an electrical power analyzer includes a voltage measurement module configured to measure voltages of lead pairs connected to prongs of an electrical plug and output analog waveform data streams of a device. A sampler and digitizer is configured to generate a power draw signature of a device based on received analog waveform data streams output from the voltage measurement module, and to digitize the analog waveform data streams. A memory is configured to store the digitized waveform streams. A communications module includes a buffer, the communications module is configured to receive and output the digitized waveform data streams. A processor is configured to compare a power draw signature of the digitized waveform streams received from the communications module with a known power draw signature of the device, and to generate a warning in response to a determination that the waveform data streams include at least one of artifacts or anomalies above a pre-set tolerance.

In an embodiment, the processor is disposed in an analysis module configured to reiteratively analyze a plurality of power draw signatures of the device over a predetermined time period, and to determine whether there is a degradation of a device operation over the predetermined time period.

In an embodiment, the analysis module is arranged in a mobile communication terminal and communicates with the communications module via short-range wireless communication.

In an embodiment, the analysis module is arranged in a mobile communication terminal and communicates with the communications module via short-range wireless communication.

In an embodiment, the electrical power analyzer is further configured to identify a power draw signature of additional devices coupled to a same branch circuit as a first device.

In one embodiment, an electrical power system for environmental and ecological optimization includes an electrical power analyzer configured for insertion into a branch electrical outlet, the electrical power analyzer including at least three prongs with at least three separate analytical leads forming at least three lead pairs, and an input receptacle that is configured to be electrically connectable to a power cord from a device being monitored. A data acquisition module including an operational amplifier configured to measure a voltage of each of the three lead pairs. A sampler and digitizer is configured to sample analog waveform data streams output from the data acquisition module and output a power draw signature of the digitized waveform data streams. A communications module is configured to record and transmit the power draw signature of the digitized waveform streams to an analysis module and to transmit a warning based on analysis of the power drawer signature performed by the analysis module.

The communications module is further figured to transmit a warning based on information received from the analysis module about an operational status of the device; and, the received information includes a potential failure risk of the device being monitored and recommended corrective action associated with the device being monitored.

The analysis module is configured to identify one or more anomalies in the received power draw signature of the device, and wherein the recommended corrective action includes an analysis of an environmental and ecological impact of a repair of the device versus a replacement of the device.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high-level, without detail, to avoid unnecessarily obscuring aspects of the present teachings.

In an overview, the application of a method and system according to the present disclosure is broad, for example, such as in server rooms where multiple devices have an optimal amount of power that can be drawn at any given time. An electronic power profile of individual servers in such server rooms should be similar across multiple devices. In addition, in the case of home appliances such as, for example, blenders, refrigerators, fans, air conditioning units, microwaves, dryers, television, etc. all have electronic profile signatures that can be used to identify and distinguish such appliances from each other.

In either case as described above, such electronic profile signatures (e.g., power draw signatures) are used to identify when a device is about to begin to fail, or have a degraded operation not noticed by a user. Thus, an early warning of a device failure, which may include recommendations for repair or replacement of the device, can increase the operational efficiency of goods and services being provided by such devices.

According to the present disclosure, an early indication that a device is not operating as expected provides both individuals and groups an opportunity to pre-empt a complete failure of a device. For example, in the case of home appliances, the complete failure of a device such as a refrigerator or washing machine is disruptive and can be more than are inconvenience, having an adverse economic impact. In the case of server rooms, for example, device failures can disrupt entire commercial operations costing considerable time and revenue.

Moreover, the application of a method and system of the present disclosure can identify devices utilizing excessive amounts of energy, and corrective action can have a beneficial impact on the environment and a reduction of a carbon footprint.

Example Architecture

Figure 1:
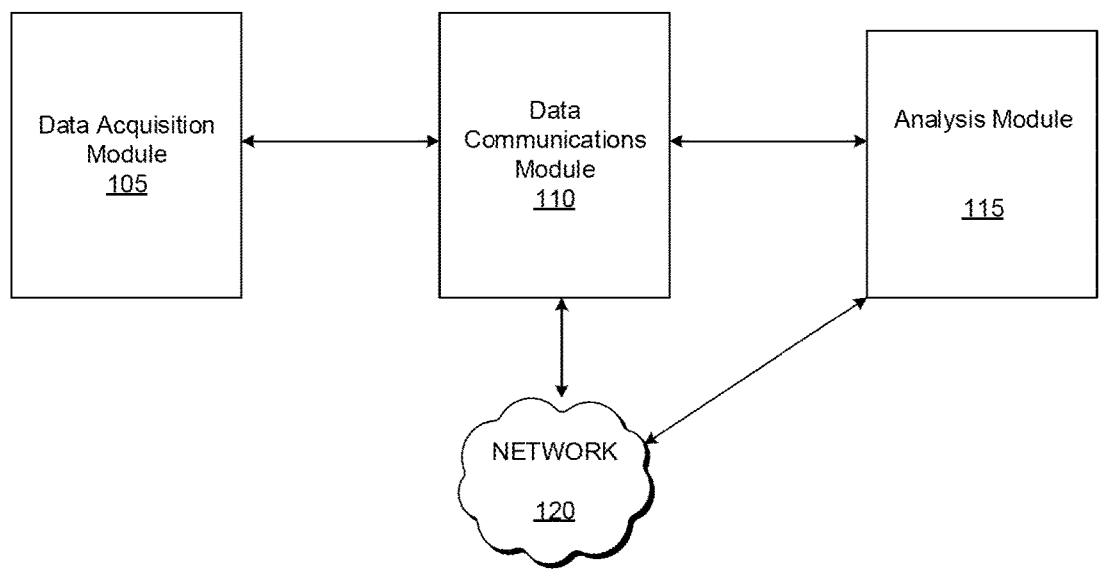
FIG. 1 is an overview of an electrical power analyzer, consistent with an illustrative embodiment.
Figure 2A:
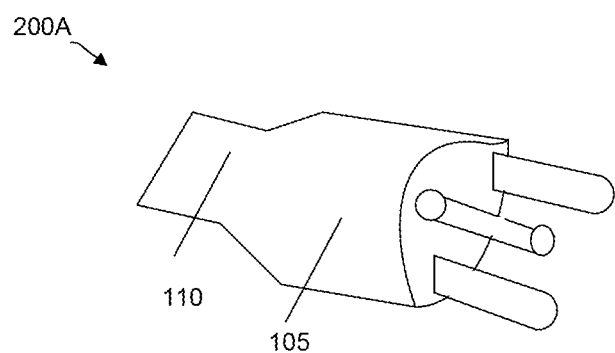
FIGS. 2A and 2B illustrate a three-prong electrical analyzer and a block diagram of the data acquisition module, respectively, consistent with an illustrative embodiment.
Figure 2B:
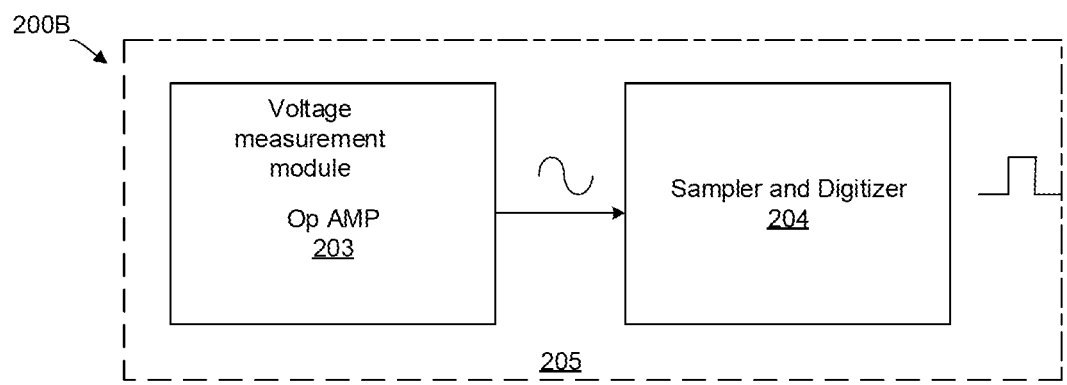

FIG. 1 is a block diagram of an electrical power analyzer 100, consistent with an illustrative embodiment. FIGS. 2A and 2B illustrate a three-prong electrical analyzer 200A and a block diagram 200B of a data acquisition module, consistent with an illustrative embodiment.

The electrical power analyzer 100, 200A in this embodiment is capable of power analysis in both large scale and small scale devices, and in a method of operation can provide for environmental and ecological optimization. The electrical power analyzer 100, 200A may be embedded in the power cord of a device during manufacture of the device, or manufacture of the power cord. Alternatively, the electrical power analyzer 100A, 200A can be a standalone device (see FIG. 2A), and may have both a receptacle to receive the power plug of the device, and prongs configured to be connected to a power source.

A data acquisition module 105, 205 is configured to obtain voltage measurement of data streams for each lead pair of a three-prong plug of a device. In this embodiment, the lead pairs are hot-Neutral, Hot-Ground, and Ground to Neutral. It is to be understood by a person of ordinary skill that other types of plugs (e.g., three-phase power for some computers and HVAC) can be adapted for electrical power analysis. Artifacts and information of interest may be found between all three lead pairs; hot-neutral, hot-ground, and ground-neutral. In most cases, in an ideal circuit, ground-neutral will not have a high-voltage powering differential across it, and it may be particularly beneficial to note artifacts on that pair.

The data acquisition module 105, 205 may include a high impedance component to measure voltages of the three lead pairs. For example, with reference to FIG. 2B, an operational amplifier 203 is one type of component that can be used. The measured voltages for each lead pair is output as an analog waveform data stream that is provided to a sampler and digitizer 204. The sampler and digitizer 204 in this embodiment s arranged in the data acquisition module, but the present disclosure is not limited to such an arrangement. The sampler and digitizer receives the analog waveform data streams, which are rapidly sampled and digitized.

The communications module 110 can include a memory such as a buffer, and transmission components. The digitized waveform data streams outlet from the data acquisition module 105 can be received by the communications module 110, stored in a buffer and then transmitted locally, or via a network 120, or via WiFi to a Cloud.

The analysis module 115 can be arranged locally in the electrical analyzer plug shown in FIG. 2A. Alternatively, the analysis module 115 can be arranged in a mobile device, or, for example, in a desktop or a server. Also consistent with the present illustrative embodiment, the analysis module 115 can be an app on a cellphone. The analysis module 115 is configured to receive the digitized data streams from the data acquisition module via the communications module 110. The analysis module 115 is also configured to compare a current power draw signature with a previously generated power signature of the device to identify anomalies and/or artifacts in the waveforms. The analysis module 115 may also be configured to compare the current power draw signature with a group of devices being similarly situated, for example, a particular model of a server, a particular brand and model of a refrigerator, etc. One way to configure the analysis module would be to classify the power draw signatures. For example, a particular make and model of a refrigerator may have the same classification attached to its profile, and the analysis module can check a particular device against other devices, or previous power drawer signatures of the same device.

The electrical power analyzer 100A, 100B can be configured as part of an Internet of Things (IoT) Network. For example, the electrical power analyzer can be configured to identify a device profile and receive other profiles over the Internet from a repository. By receiving the device profiles of other devices coupled to a first device connected to the electrical power analyzer 100A, 100B, a power draw signature of additional devices coupled to the first device can be identified by the electrical analyzer 100A, 100B.

In addition, the electrical power analyzer 100A, 200A can be configured so that when plugged into an electrical outlet, the electrical power analyzer 100A, 200A can detect and identify other devices connected to the same branch circuit. For example, the power drawer signature of a washing machine is quite different from, for example, a toaster, and thus these additional devices can be monitored based on the power drawer signature of their device profile.

Figure 3:
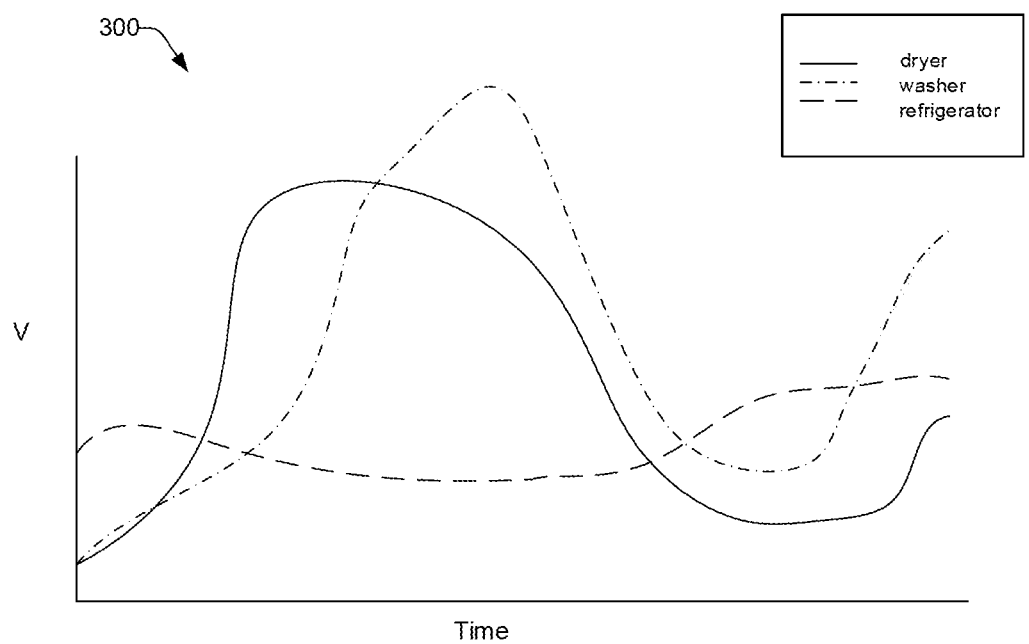
FIG. 3 is an illustration of an analog power draw signature of home appliances consistent, with an illustrative embodiment.

FIG. 3 is an illustration of analog power draw signatures, consistent with an illustrative embodiment. For example, power profiles of a washer, dryer and a refrigerator are shown, power versus time.

Figure 4:
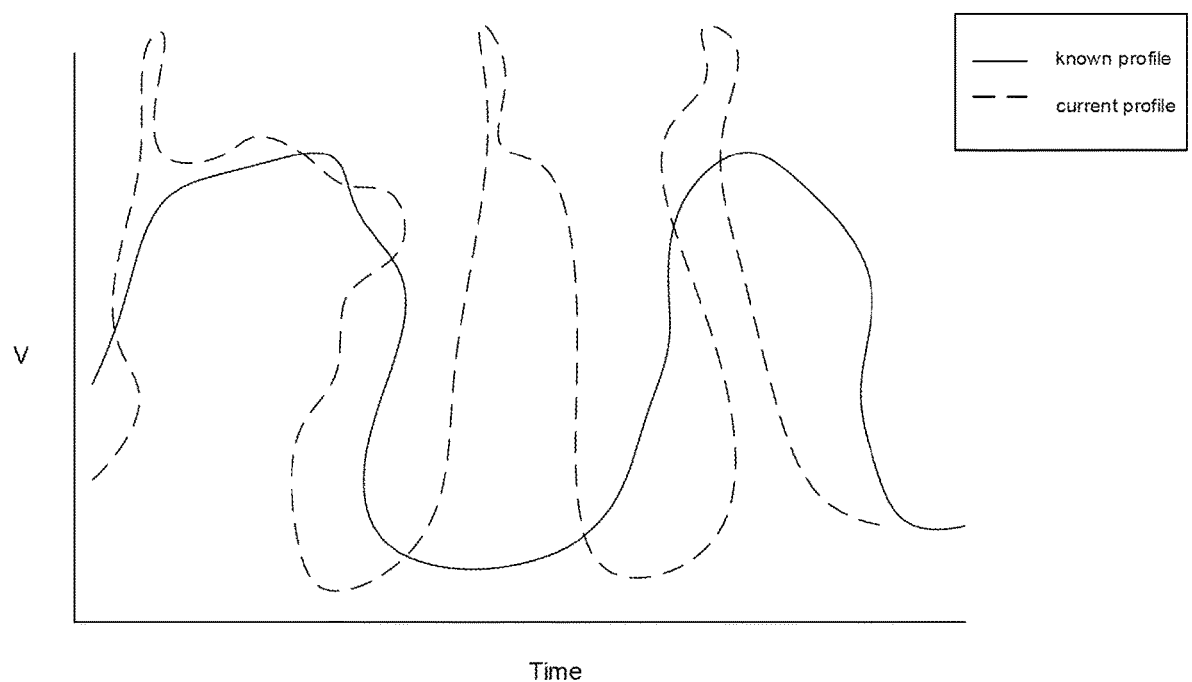
FIG. 4 is an illustration of current power draw signature of a device compared with a previously-generated power draw signature, consistent with an illustrative embodiment.

FIG. 4 shows a comparison of a current power draw signature of a device and a previously-generated power draw signature, consistent with an illustrative embodiment. It can be seen that the current power draw (dashed lines) is showing spikes and erratic timing. In this case, the analysis module 115 would generate a warning that a failure is imminent based on the spikes and the erratic timing in the current power drawer. It is to be understood that a failure is imminent in that there has not been a hard failure of a device, but based on the power draw signature having anomalies that can be indicative as a prediction that failure is imminent. For example, temporary errors, excessive noise, vibrations, may adversely impact the power draw signature. These anomalies can be used to determine a failure is imminent, and to warn that action should be taken to repair or replace the device before it becomes non-functional. In an embodiment, the warning may be replaced with or accompanied by repair recommendations regarding certain parts, or an instruction to use another device as a replacement.

In an embodiment, the power drawer signatures such as shown in FIG. 4 may be supplemented with the device building a library for further analysis by Artificial Intelligence (AI). For example, machine learning can be utilized to identify anomalous or failure-indicating activity. The machine learning may be supervised or unsupervised.

During a training phase, when machine learning is supervised, a trainer labels examples of input and output examples. For example, historical data, such as power profiles of devices, may be provided to an algorithm in a training phase.

In unsupervised learning, the algorithm is supplied with unlabeled data, so the algorithm finds commonalities among the data. The algorithm in unsupervised learning can find hidden patterns in data, and is particularly suited for detecting anomalies in patterns. In the case of power profiles, unsupervised learning can be used to build a library of device usage, and may include similar types of devices. For example, similar types of servers, or similar types of home appliances can be grouped to detect patterns and anomalies when there is a degradation of device operation.

Such algorithms can operate by building a model from stored prior inputs or baselines therefrom to make data-driven predictions or decisions (or to provide threshold conditions) to indicate whether a communication thread belongs to a predetermined, rather than following strictly static criteria. Based on machine learning, there can be patterns and trends that are identified, and any outliers identified as not belonging to the cluster.

In various embodiments, machine learning may make use of techniques including supervised learning, unsupervised learning, semi-supervised learning, naïve Bayes, Bayesian networks, decision trees, neural networks, fuzzy logic models, and/or probabilistic classification models.

Example Processes

Figure 5:
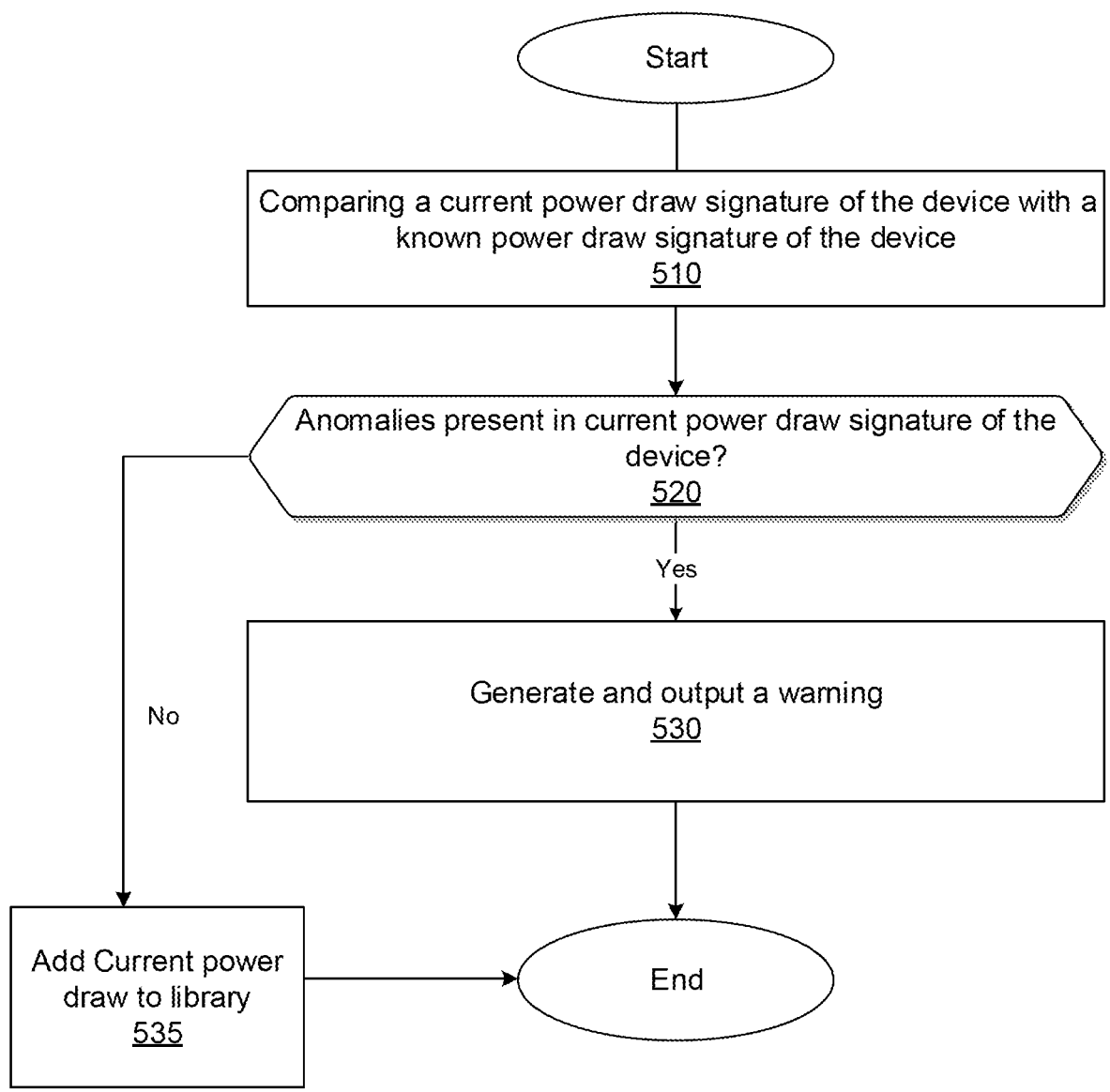
FIG. 5 is a flowchart of a method to identify an anomaly in a device operation, consistent with an illustrative embodiment.

With the foregoing overview of the example architecture, it may be helpful now to consider a high-level discussion of example processes. To that end, FIG. 5 is a flowchart 500 of a method to identify anomalies in device operation consistent with an illustrative embodiment.

At operation 510, there is a comparing of a current power draw signature of the device with a known power draw signature of the device. The current power draw signature can be obtained by the data acquisition module 105 shown in FIG. 1. The voltages of each of the lead pairs (in this example, there are three) are measured by a high-impedance device such as an IC operational amplifier 203 such as shown in FIG. 2B. In an embodiment, each lead pair is passively connected to a high-impedance, digitized, time-stamped oscilloscope storage function, which can be remotely stored and analyzed, or communicated. The data acquisition module 105 may sample and digitize each of the waveform data streams. The known power draw signature, for example, may be stored in a memory. The comparing operation can be performed by an analyzer module 115 such as shown in FIG. 1.

At operation 520, it is determined whether anomalies are present in the current power draw signature based on the comparison of the current power draw signature with the known power draw signature. In addition, each lead pair can have its continuing waveform analyzed. Many parameters can be stored, reviewed and analyzed. The present, evolving and evolutionary aspects or voltage, current, phase, apparent impedance, power factor, and transient spikes, jitter and artifacts can be analyzed. As discussed hereinabove, the storage, review, and analysis can be communicated off-site for AI or cognitive operations. Based on both local parameters and off-site AI cognitive operations, maintenance or replacement of a particular device can be recommended.

If the decision at operation 520 is affirmative, that anomalies are present, then at operation 530, a warning is generated and output. The warning can be output by the data communications module 110 shown in FIG. 1. The warning may be output to one or more predetermined devices, such as a mobile communication terminal, a server, notebook, desktop, tablet, just to name a few non-limiting possibilities. The warning may be transmitted via network 120 (shown in FIG. 1) or, for example via WiFi to intended recipients. The warnings may also be classified, and according to severity, may be reported along with an activation of auditory and/or audio visual alarms.

In an embodiment, the warning includes a description of the anomalies detected, and in the event that the anomalies are associated with an imminent failure of the device, a recommended repair or replace information can be output with the warning.

If the decision at operation 520 is negative, that no anomalies are present, then at operation 535 the current power drawer is stored (added to) the library of known power draw signatures for one or more similar devices. Thus, a library of power draw signatures is built for the device. As discussed hereinabove, machine learning can also be used to build the library of power draw signatures. In addition, by adding a plurality of power draw signatures for a device over a predetermined time period of a particular quantity of power draw signatures can be analyzed to determine whether there is a degradation of operation of the device that may not yet be considered an anomaly. For example, an increase in noise, a decrease in signal strength, etc., are just two possible examples of degradation that may be detected by analyzing a plurality of power draw signature. The method then ends after performing one of operation 530 or 535.

In an embodiment, the expected behavior of devices can be synthesized or extracted from manufacturer's engineering data. In addition, based on the aforementioned review and analysis, based on local parameters and off-site AI cognitive operations, a recommendation can be made to keep and repair a device based on the consideration of the environmental impact of discarding and replacing the device, and in consideration of the ecological replacement footprint.

Example Computer Platform

As discussed above, functions relating to performing a device and method to identify an anomaly in operation of a device can be performed with the use of one or more computing devices connected for data communication via wireless or wired communication, as shown in FIGS. 1 and 2, and in accordance with the process 500 of FIG. 5.

Figure 6:
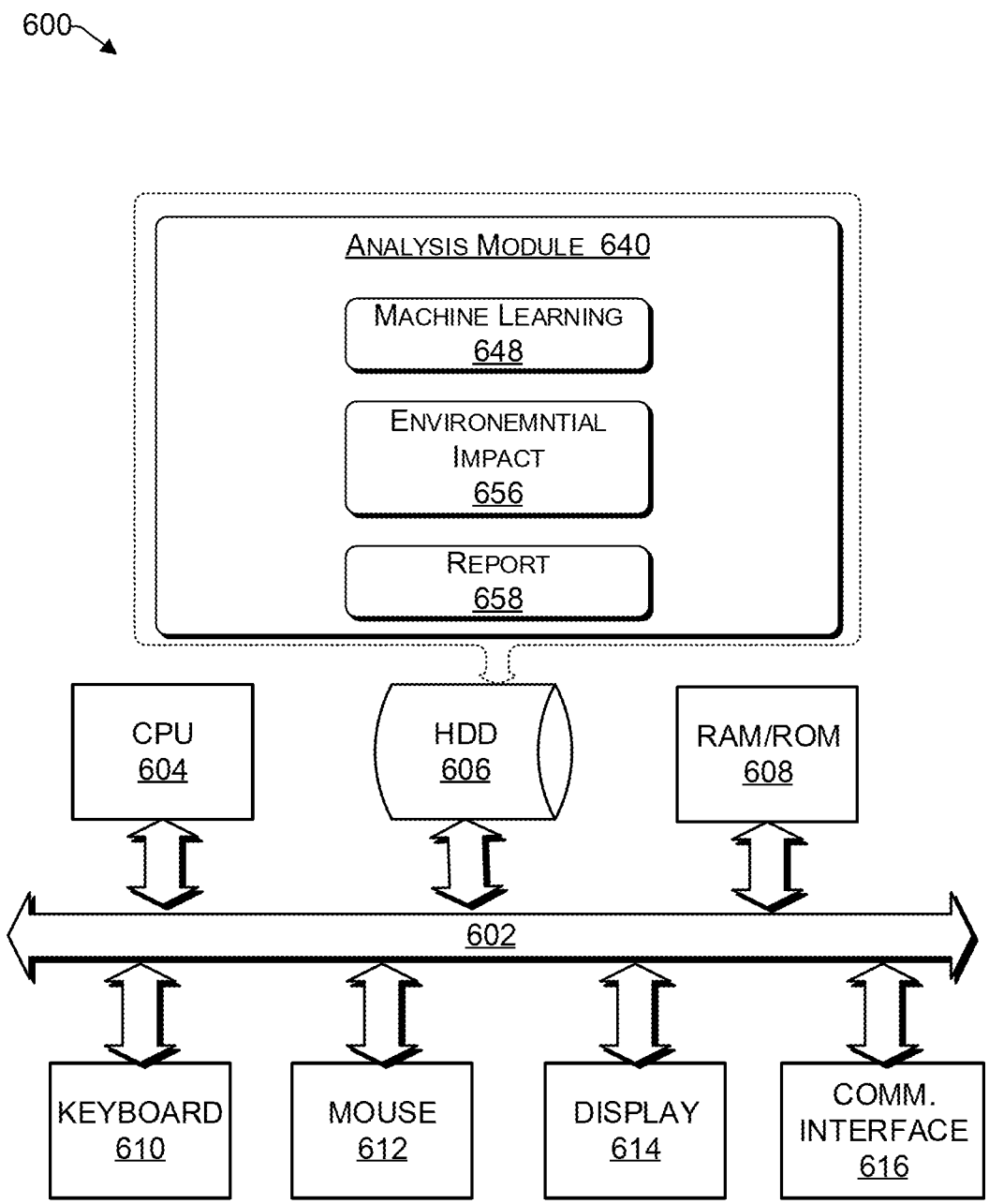
FIG. 6 is a functional block diagram illustration of a computer hardware platform.

FIG. 6 provides a functional block diagram illustration of a computer hardware platform that is capable of communicating with a system as discussed herein. In particular, FIG. 6 illustrates a network or host computer platform 600, as may be used to implement the electrical power analyzer of FIG. 1.

The computer platform 600 may include a central processing unit (CPU) 604, a hard disk drive (HDD) 606, random access memory (RAM) and/or read only memory (ROM) 608, a keyboard 610, a mouse 612, a display 614, and a communication interface 616, which are connected to a system bus 602.

In one embodiment, the HDD 606, has capabilities that include storing a program that can execute various processes, such as analysis module 640, in a manner described herein. The analysis module 640 may have various modules configured to perform different functions. The HDD 606 can include data stores.

For example, related terms to a conversational system that received a query. There may be a machine learning module 648 operative to learn power draw signatures of similar devices, during a training phase, as to whether items such as, but not limited to anomalies are present in the power draw signature under review. An environmental impact module 656 determines whether it is ecologically desirable to keep and repair a device rather than discard it. A report module 658 is configured to report a warning and a possible repair or replacement recommendation of a device based on the anomaly.

In one embodiment, a program, such as Apache™, can be stored for operating the system as a Web server. In one embodiment, the HDD 606 can store an executing application that includes one or more library software modules, such as those for the Java™ Runtime Environment program for realizing a JVM (Java™ virtual machine).

Example Cloud Platform

Figure 7:
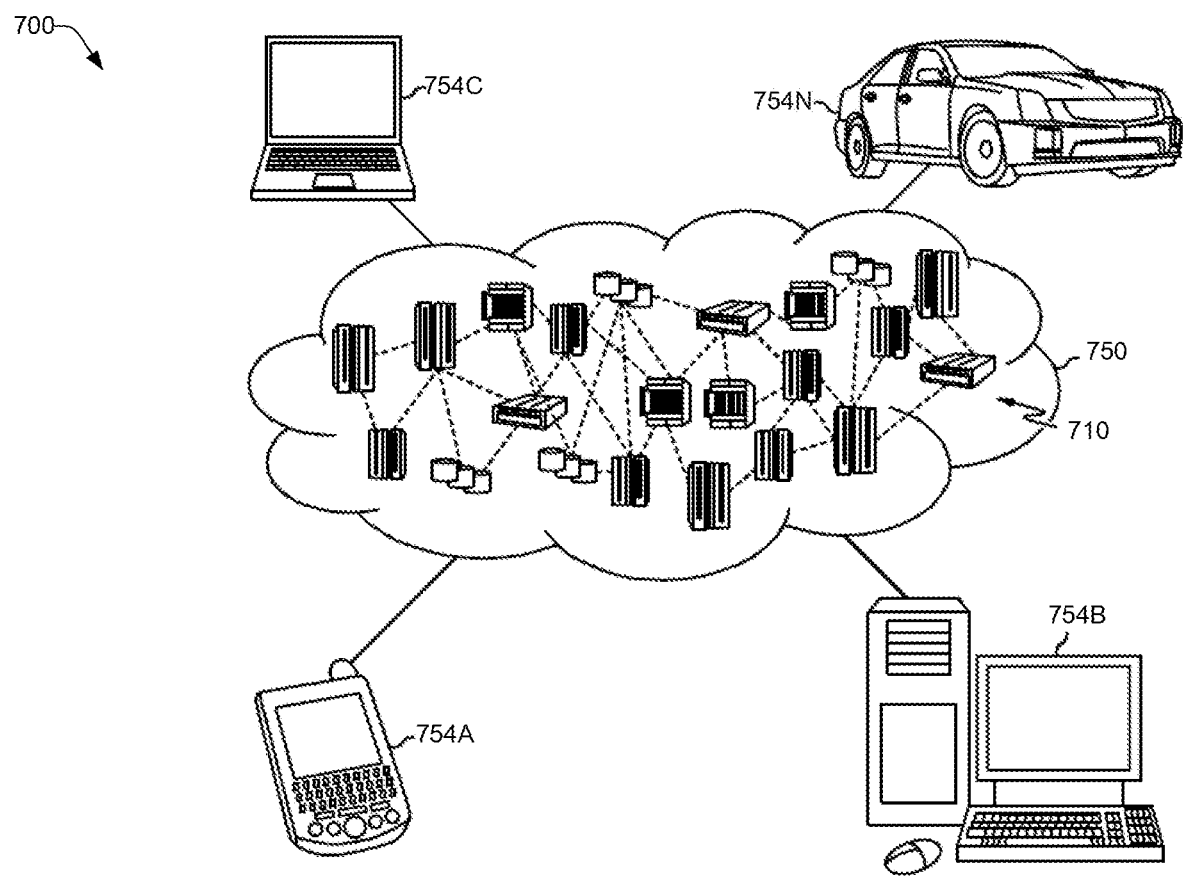
FIG. 7 depicts an illustrative cloud computing environment utilizing cloud computing.

As discussed above, functions relating to the electrical power analyzer for large and small scale devices for environmental and ecological optimization method may include a cloud 750 (see FIG. 7). It is to be understood that although this disclosure includes a detailed description of cloud computing as discussed hereinbelow, implementation of the teachings recited herein is not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service-oriented with a focus on statelessness, low coupling, modularity, and semantic interoperability. At the heart of cloud computing is an infrastructure that includes a network of interconnected nodes.

Referring now to FIG. 7, an illustrative cloud computing environment 700 utilizing cloud computing is depicted. As shown, cloud computing environment 700 includes cloud 750 having one or more cloud computing nodes 710 with which local computing devices used by cloud consumers, such as, for example, personal digital assistant (PDA) or cellular telephone 754A, desktop computer 754B, laptop computer 754C, and/or automobile computer system 754N may communicate. Nodes 710 may communicate with one another. They may be grouped (not shown) physically or virtually, in one or more networks, such as Private, Community, Public, or Hybrid clouds as described hereinabove, or a combination thereof. This allows cloud computing environment 700 to offer infrastructure, platforms and/or software as services for which a cloud consumer does not need to maintain resources on a local computing device. It is understood that the types of computing devices 754A-N shown in FIG. 7 are intended to be illustrative only and that computing nodes 710 and cloud computing environment 750 can communicate with any type of computerized device over any type of network and/or network addressable connection (e.g., using a web browser).

Figure 8:
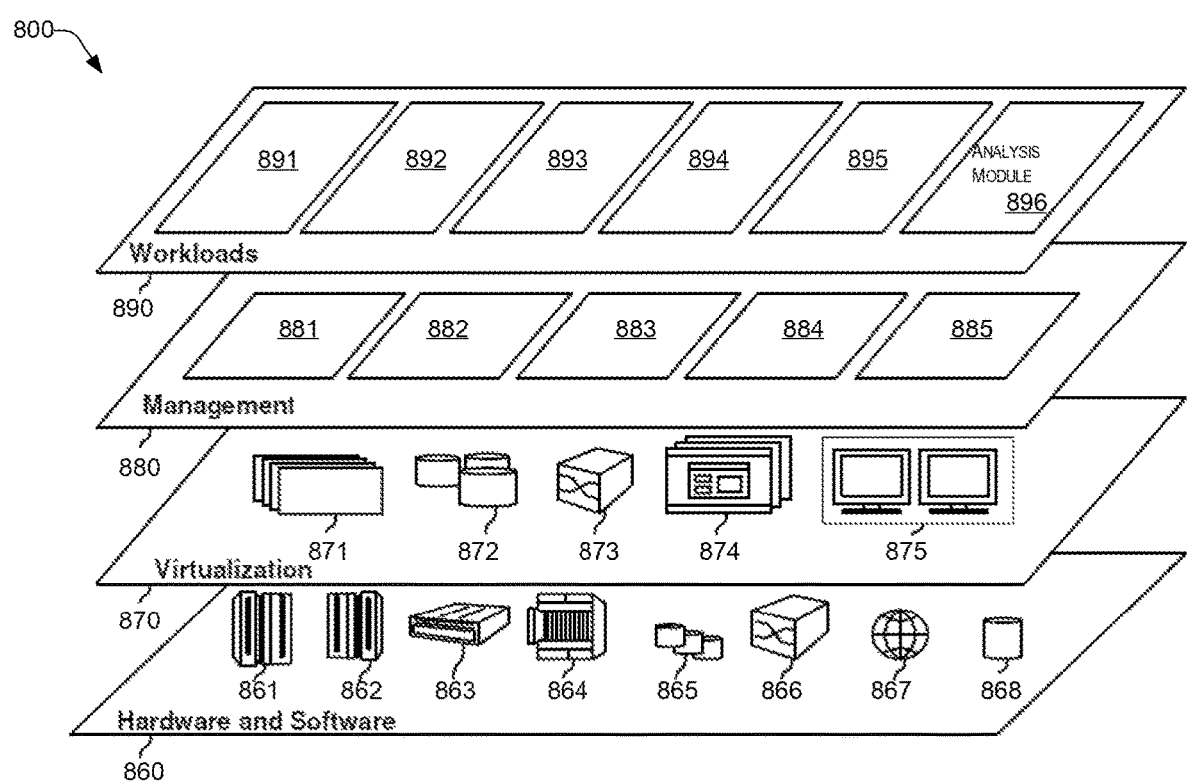
FIG. 8 depicts a set of functional abstraction layers provided by a cloud computing environment.

Referring now to FIG. 8, a set of functional abstraction layers provided by cloud computing environment 800 (FIG. 8) is shown. It should be understood in advance that the components, layers, and functions shown in FIG. 8 are intended to be illustrative only and embodiments of the disclosure are not limited thereto. As depicted, the following layers and corresponding functions are provided:

Hardware and software layer 860 include hardware and software components. Examples of hardware components include: mainframes 861; RISC (Reduced Instruction Set Computer) architecture based servers 862; servers 863; blade servers 864; storage devices 865; and networks and networking components 866. In some embodiments, software components include network application server software 867 and database software 868.

Virtualization layer 870 provides an abstraction layer from which the following examples of virtual entities may be provided: virtual servers 871; virtual storage 872; virtual networks 873, including virtual private networks; virtual applications and operating systems 874; and virtual clients 875.

In one example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Examples of workloads and functions which may be provided from this layer include: mapping and navigation 891; software development and lifecycle management 892; virtual classroom education delivery 893; data analytics processing 894; transaction processing 895; and an analysis module 896, as discussed herein.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A computer-implemented method of identifying an anomaly in an operation of a device, comprising:
   measuring voltages of lead pairs connected to respective prongs of an electrical plug;
   determining, based on the measurement, a current power draw signature of the device based on an analog waveform data stream of the device;
   digitizing the analog waveform data stream;
   comparing, by an electrical power analyzer coupled to an electrical outlet, the current power draw signature of the device with a known power draw signature of the device;
   determining whether at least one anomaly is present in the current power draw signature indicating an imminent failure of the device; and
   generating a warning in response to determining the at least one anomaly is present in the current power draw signature.

2. The computer-implemented method of claim 1, further comprising storing the current power draw signature.

3. The computer-implemented method of claim 1, wherein the generating of the warning further comprises recommending at least one of repair or replacement of the device based on the at least one anomaly.

4. The computer-implemented method of claim 1, wherein the device is a first device and the electrical analyzer is coupled to an Internet of Things (IoT) network, and the method further comprising identifying by a power draw signature additional devices coupled to the first device, and
   receiving device profiles over the Internet from a repository.

5. The computer-implemented method of claim 1, wherein the device comprises a first device, and further comprising identifying a power draw signature of additional devices coupled to a same branch circuit as the first device.

6. The computer-implemented method of claim 1, further comprising receiving, by the electrical power analyzer, a device power profile including the known power draw signature of the device.

7. The computer-implemented method according to claim 6, further comprising receiving the device power profile from a plurality of similarly-classified types of devices.

8. The computer-implemented method according to claim 1, further comprising utilizing machine learning in determining the at least one anomaly, and that the at least one anomaly includes failure-indicating activity.

9. The computer-implemented method according to claim 1, wherein the comparing of the current power draw signature of the device with the known power draw signature further comprises:
   reviewing a plurality of power draw signatures of the device over a predetermined time period; and
   determining whether the at least one anomaly over the predetermined time period indicates a degraded operation of the device.

10. An electrical power analyzer, comprising:
    a voltage measurement module configured to measure voltages of lead pairs connected to respective prongs of an electrical plug and to output analog waveform data streams of a device;
    a sampler and digitizer configured to generate a current power draw signature of the device based on received analog waveform data streams output from the voltage measurement module, and to digitize the analog waveform data streams;

a memory configured to store the digitized waveform streams; and a communications module including a buffer, the communications module configured to receive and output the digitized waveform data streams; and a processor configured to compare the current power draw signature of the digitized waveform streams received from the communications module with a known power draw signature of the device, and to generate a warning in response to a determination that the waveform data streams include at least one of an anomaly or artifact.

11. The electrical power analyzer according to claim 10, wherein the processor is further configured to include in the generated warning a recommendation to repair or replace the device based on the determined at least one of anomaly or artifact in the waveform data streams.

12. The electrical power analyzer according to claim 10, further comprising a receptacle configured to receive the leads of a power cord of the device, and prongs configured to be connected to a power source.

13. The electrical power analyzer according to claim 12, wherein the analysis module is further configured to determine whether the device having the at least one anomaly includes a failure-indicating activity associated with an imminent failure of the device; and wherein the analysis module is further configured to determine whether the device having the failure-indicating activity is to be repaired or be replaced based on a smaller ecological footprint.

14. The electrical power analyzer according to claim 13, wherein the device comprises a first device, and wherein the electrical power analyzer is further configured to identify a power draw signature of additional devices coupled to a same branch circuit as the first device.

15. The electrical power analyzer according to claim 10, further comprising an analysis module configured to reiteratively analyze a plurality of power draw signatures of the device over a predetermined time period, and to determine whether there is a degradation of a device operation over the predetermined time period.

16. The electrical power analyzer according to claim 15, wherein the analysis module is arranged in a mobile communication terminal and configured to communicate with the communications module via short-range wireless communication.

17. The electrical power analyzer according to claim 10, configured for coupling to an Internet of Things (IoT) network, and further configured to:

identify a power draw signature of additional devices coupled to the first device; and receive device profiles of the additional device over the internet from a repository and identify a device profile based on the power draw signature.

18. An electrical power system for environmental and ecological optimization, the system comprising:

an electrical power analyzer configured for insertion into a branch electrical outlet, the electrical power analyzer including at least three prongs with at least three separate analytical leads forming at least three lead pairs, and an input receptacle configured to be electrically connectable to a power cord from a device being monitored;

a data acquisition module including an operational amplifier configured to measure a voltage of each of the three lead pairs;

a sampler and digitizer configured to sample analog waveform data streams output from the data acquisition module and output a power draw signature of the digitized waveform data streams; and a communications module configured to record and transmit the power draw signature of the digitized waveform streams to an analysis module and to transmit a warning based on analysis of the power drawer signature performed by the analysis module;

wherein the communications module is further configured to transmit a warning based on information received from the analysis module about an operational status of the device; and wherein the received information includes a potential failure risk of the device being monitored and recommended corrective action associated with the device being monitored.

19. The system according to claim 18, wherein the analysis module is configured to identify one or more anomalies in the received power draw signature of the device, and wherein the recommended corrective action includes an analysis of an environmental and ecological impact of a repair of the device versus a replacement of the device; and wherein the communications module is further configured to transmit the warning to one or more designated recipients.

20. The system according to claim 19, wherein the communications module is configured to send and receive information regarding the power draw signatures to the analysis module via at least one of a cloud or a local network.

* * * * *